US012542383B2

(12) United States Patent
Cheng

(10) Patent No.: US 12,542,383 B2
(45) Date of Patent: Feb. 3, 2026

(54) CHIP CONNECTOR WITH AN IMPROVED ROTATING PLATE

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventor: Shan-Yong Cheng, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 386 days.

(21) Appl. No.: 18/109,697

(22) Filed: Feb. 14, 2023

(65) Prior Publication Data

US 2023/0261398 A1 Aug. 17, 2023

(30) Foreign Application Priority Data

Feb. 16, 2022 (CN) .......................... 202210141207.5

(51) Int. Cl.
| H01R 12/70 | (2011.01) |
| H01R 12/71 | (2011.01) |
| H01R 12/88 | (2011.01) |
| H01R 13/516 | (2006.01) |

(52) U.S. Cl.
CPC ....... *H01R 12/7047* (2013.01); *H01R 12/716* (2013.01); *H01R 12/88* (2013.01); *H01R 13/516* (2013.01)

(58) Field of Classification Search
CPC .. H01R 12/7047; H01R 12/716; H01R 12/88; H01R 13/516; H01R 12/714; H01R 12/7076; H01R 12/71; H01R 13/40; H01R 13/502; H05K 7/1053
See application file for complete search history.

(56) References Cited

U.S. PATENT DOCUMENTS

| 5,387,120 A * | 2/1995 | Marks | H05K 7/1023 439/73 |
| 7,575,449 B1 * | 8/2009 | Cai | H05K 7/1053 439/135 |
| 8,052,429 B1 * | 11/2011 | Gattuso | H05K 7/1053 439/73 |

(Continued)

FOREIGN PATENT DOCUMENTS

CN 211980932 U 11/2020

*Primary Examiner* — Truc T Nguyen
(74) *Attorney, Agent, or Firm* — Ming Chieh Chang

(57) ABSTRACT

A chip connector adapted for electrically connecting a chip module to a circuit board includes: an insulative housing loaded with plural terminals and mounted on the circuit board; a frame surrounding the insulative housing and mounted on the circuit board; and a rotating plate defining a first end and a second end opposite to the first end, the first end of the rotating plate being pivotally installed on a first end of the frame; wherein the second end of the rotating plate defines a first locking portion, the frame defines a second locking portion at a second end opposite to the first end thereof, and the first locking portion is releasably locked with the second locking portion by pushing the rotating plate toward the frame.

12 Claims, 9 Drawing Sheets

(56) References Cited

U.S. PATENT DOCUMENTS

| | | | |
|---|---|---|---|
| 8,747,120 B2 * | 6/2014 | Terhune, IV | H01R 13/627 439/41 |
| 10,038,258 B2 * | 7/2018 | Xiao | H01R 13/62 |
| 2008/0057751 A1 * | 3/2008 | Zhang | H05K 7/1061 439/73 |
| 2009/0023330 A1 * | 1/2009 | Stoner | H01R 12/62 439/493 |
| 2009/0221159 A1 * | 9/2009 | Fan | H05K 7/1061 439/71 |
| 2011/0269326 A1 * | 11/2011 | Hsu | H05K 7/1053 439/296 |
| 2011/0294330 A1 * | 12/2011 | Dai | H05K 7/1053 439/331 |
| 2012/0289075 A1 * | 11/2012 | Yeh | H05K 7/1053 439/345 |
| 2013/0084737 A1 * | 4/2013 | Cai | H05K 7/1007 439/573 |
| 2014/0377976 A1 * | 12/2014 | Tsai | H04B 1/3818 439/345 |
| 2017/0149168 A1 * | 5/2017 | Wang | H01R 13/5213 |
| 2021/0126389 A1 | 4/2021 | Foxconn | |
| 2022/0328989 A1 | 10/2022 | Foxconn | |
| 2023/0140671 A1 * | 5/2023 | Wang | H01R 13/621 439/55 |

* cited by examiner

CHIP CONNECTOR WITH AN IMPROVED ROTATING PLATE

BACKGROUND OF THE INVENTION

Field of the Invention

The present invention relates generally to a chip connector with a rotating plate.

Description of Related Arts

In China Patent No. 211980932U, a rotating plate of a connector is pivotally mounted on a frame and the rotating plate can be opened and closed relative to the frame. The rotating plate together with the frame is then assembled on a circuit board. The rotating plate tightened with nuts and bolts needs to be opened and closed many times during a chip module is inserted into the connector. It takes plenty of time for loosening or tightening the nuts and the bolts.

Therefore, it is necessary to provide a chip connector with an improved structure to overcome the above defects.

SUMMARY OF THE INVENTION

The objective of the present invention is to provide a chip connector with a rotating plate.

To achieve the above object, a chip connector adapted for electrically connecting a chip module to a circuit board comprises: an insulative housing loaded with a plurality of terminals and mounted on the circuit board; a frame surrounding the insulative housing and mounted on the circuit board; and a rotating plate defining a first end and a second end opposite to the first end, the first end of the rotating plate being pivotally installed on a first end of the frame; wherein the second end of the rotating plate defines a first locking portion, the frame defines a second locking portion at a second end opposite to the first end thereof, and the first locking portion is releasably locked with the second locking portion by pushing the rotating plate toward the frame.

Other advantages and novel features of the invention will become more apparent from the following detailed description of the present embodiment when taken in conjunction with the accompanying drawings.

DETAILED DESCRIPTION OF THE PREFERRED EMBODIMENT

Figure 5:
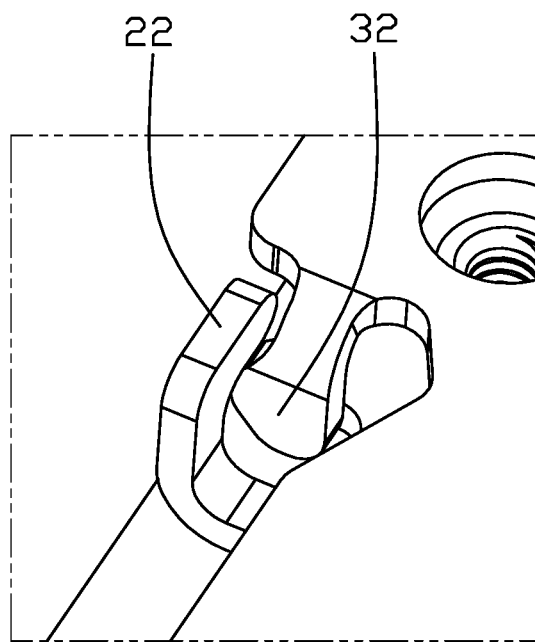
FIG. 5 is an enlarged perspective view of a part of the chip connector in FIG. 3.
Figure 6:
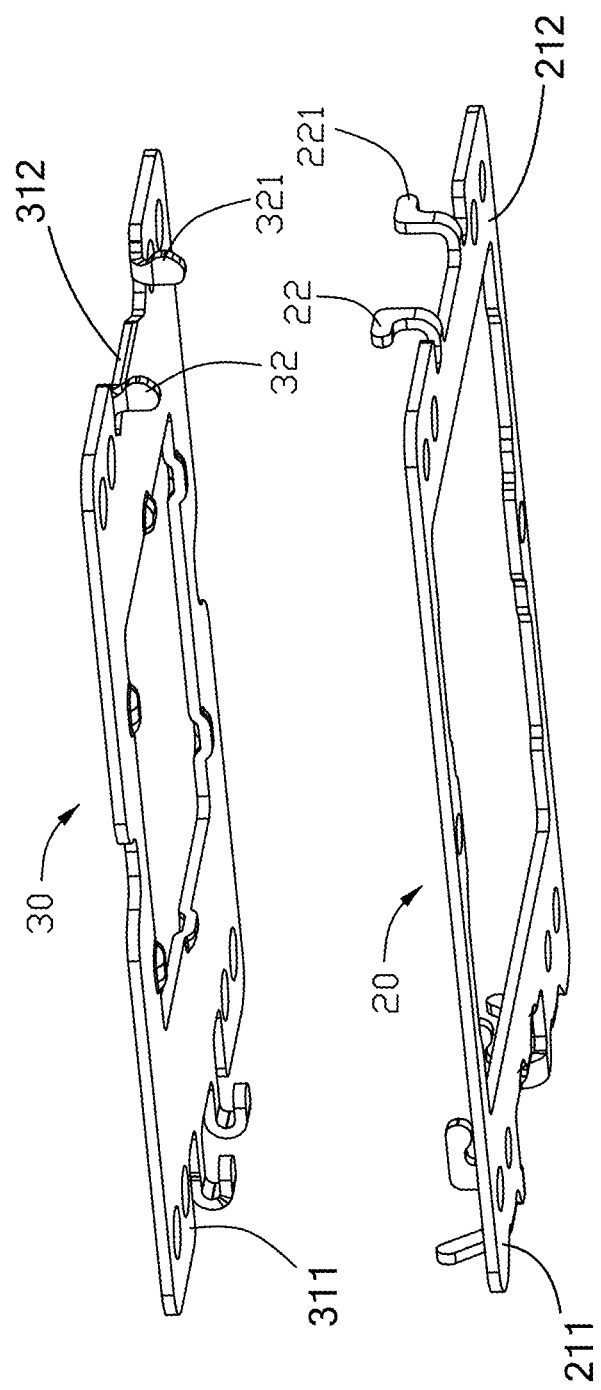
FIG. 6 is a perspective view of the rotating plate and a frame body of the chip connector.
Figure 7:
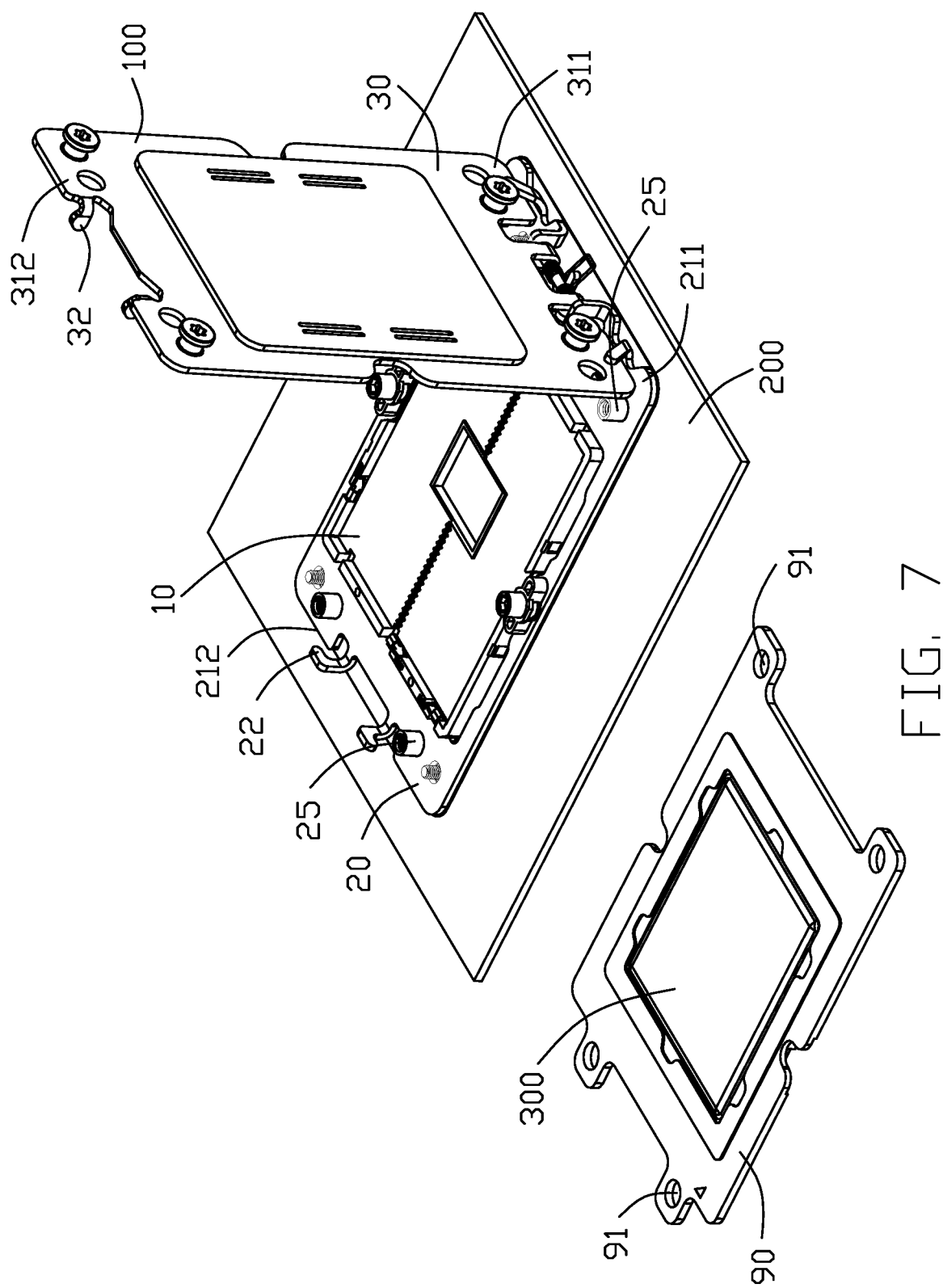
FIG. 7 is a perspective view of the chip connector on the circuit board and a chip module, wherein the chip module is prepared to be installed into the chip connector.

Referring to FIGS. 1-9, a chip connector 100 for electrically connecting a chip module 300 to a circuit board 200 is illustrated. The chip connector 100 comprises an insulative housing 10 loaded with a plurality of conductive terminals thereon, a frame 20 surrounding the housing 10, and a rotating plate 30 which has opposite first end 311 and second end 312. As shown in FIG. 7, the housing 10 and the frame 20 are retained on the circuit board 200, the first end 311 of the rotating plate is pivotally installed on a first end 211 of the frame 20 and the rotating plate 30 has a tendency to rotate outwards via a torque spring, the second end 312 of the rotating plate 30 has a first locking portion 32 and a second end 212 of the frame 20 has a second locking portion 22 with which the first locking portion 32 can be locked by pressing. Compared with rotation of a screw for locking in the prior art, the locking process in the present invention can be simply achieved by pressing the second end 312 to releasably lock the first locking portion 32 of the rotating plate 30 to the second locking portion 22 of the frame 20.

A further description according to an assembling order of the chip connector is given below.

Figure 1:
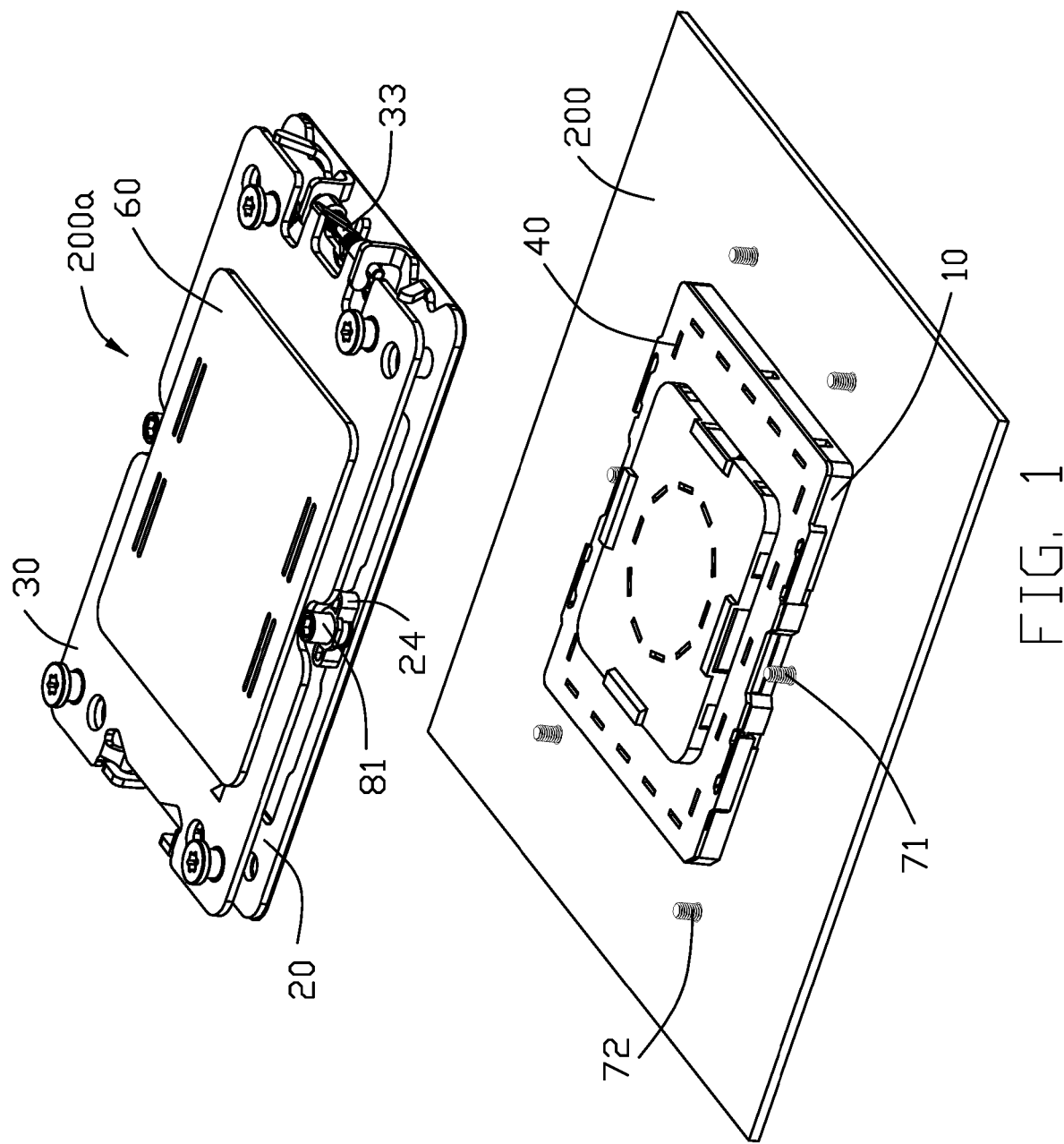
FIG. 1 is a perspective view of a chip connector and a circuit board of an embodiment of this present invention, wherein a housing with a protective cover is installed on a circuit board, and an independent carrying device is prepared to be installed on the circuit board.
Figure 2:
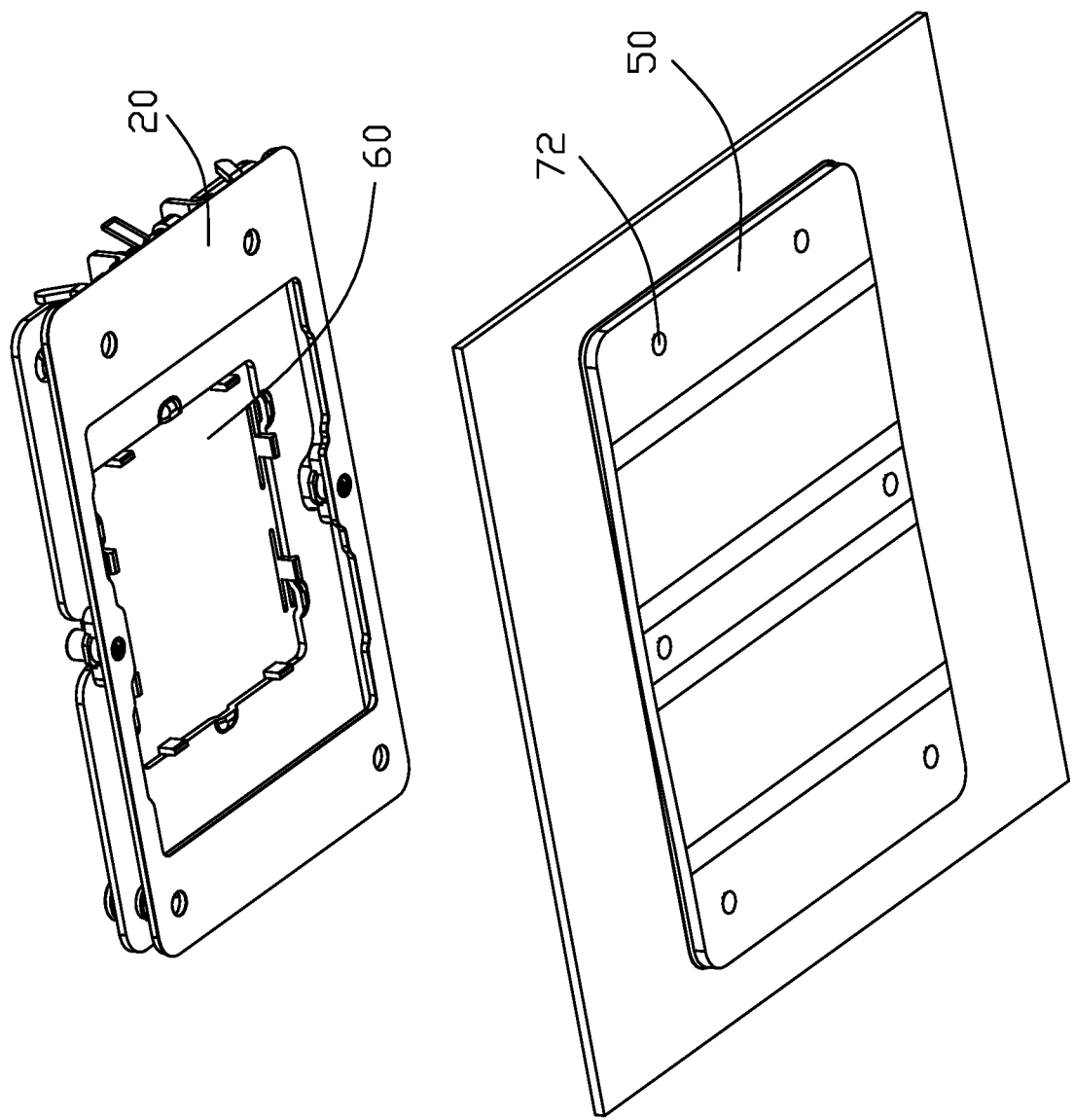
FIG. 2 is another perspective view of the chip connector and the circuit board of FIG. 1.

Referring to FIGS. 1-2, the housing 10 with a protective cover 40 is mounted on the circuit board 200, the cover 40 provides protecting and dustproof performance. The protective cover 40 can also be vacuumed by an external suction member to make the housing 10 to move. The conductive terminals arranged in the housing 10 are soldered to an upper face of the circuit board 200, and a back plate 50 is installed on a lower face of the circuit board 200. Six bolts 71, 72 extend upwards from the lower face of the back plate 50 to the upper face of the circuit board 200 through holes (not labeled) in the back plate 50 and the circuit board 200. The first end 311 of the rotating plate 30 is mounted on the first end 211 of the frame 20 via a torsion shaft 33 which provides torsion force so that the rotating plate 30 tends to rotate upwards and away from the housing 10. The rotating plate 30 rotates until it is parallel to the housing 10 and the first locking portion 32 of the rotating plate 30 is locked with the second locking portion 22 of the frame 20. The rotating plate 30 and the frame 20 are constructed as an independent loading mechanism (ILM) 200a in the industry. A central opening of the rotating plate 30 is covered with a dustproof cover 60 when no chip module is inserted.

Figure 3:
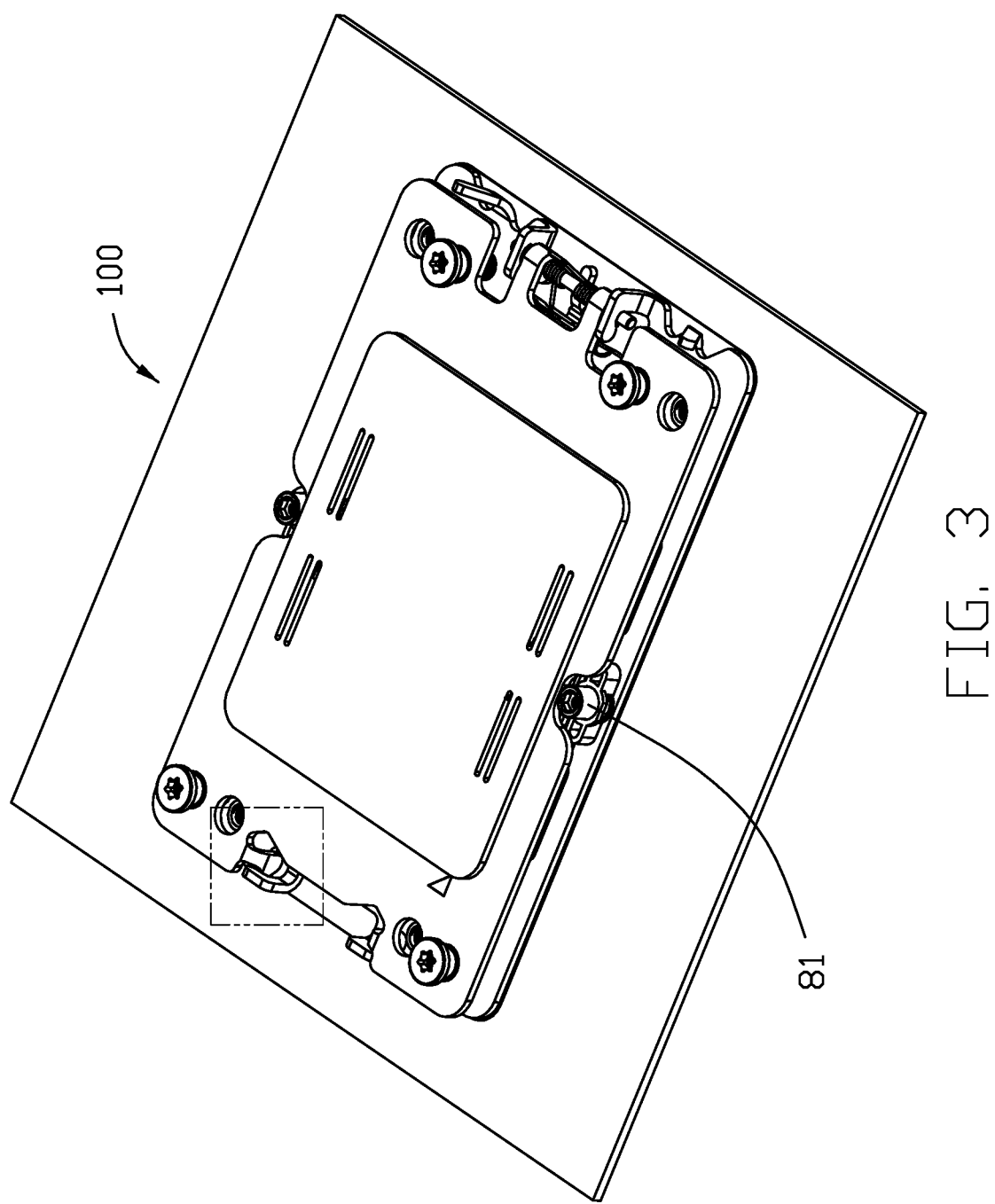
FIG. 3 is a perspective view of the independent carrying device and the circuit board on which the independent carrying device is installed.
Figure 4:
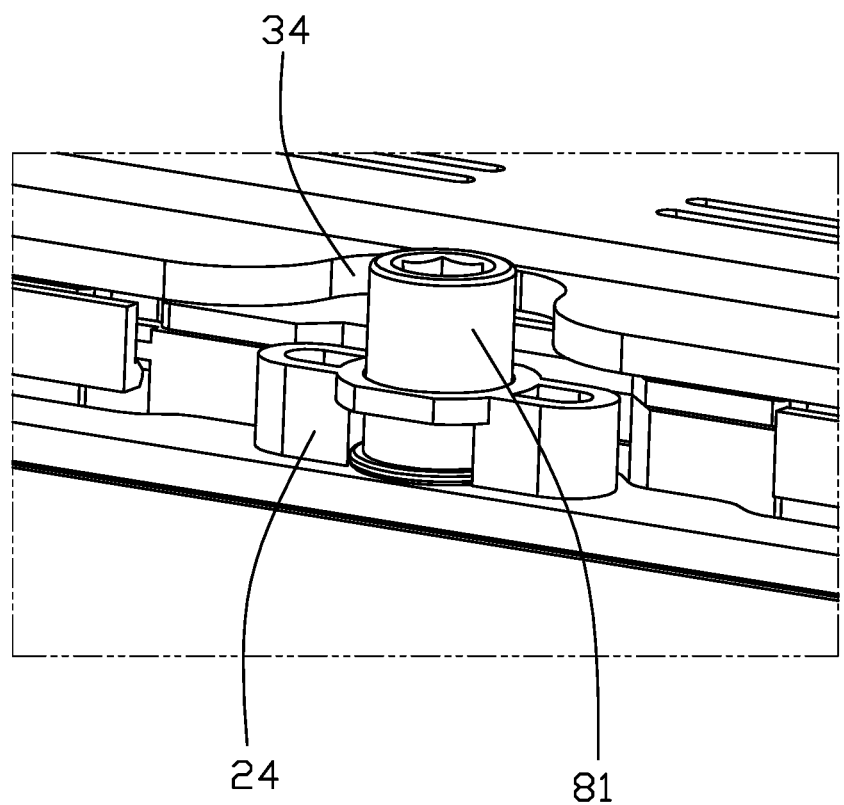
FIG. 4 is an enlarged perspective view of a part of the chip connector in FIG. 3.

After the housing 10 with terminals is soldered on the circuit board 200, the independent loading mechanism 200a is placed on the upper face of the circuit board 200 and surrounds the housing, two first bolts 71 pass through positioning portions 24 on both sides of the frame 20 and co-operate with two first nuts 81, so that the independent loading mechanism 200a is fixed on the circuit board, as shown in FIG. 3. As clearly shown in FIG. 4, the rotating plate 30 defines a notch 34 through which the first bolts 71 and the first nut 81 pass.

As shown in FIGS. 5-6, the first locking portion 32 of an upright tab bends downward from the rotating plate 30 and defines a locking convex 321 away from the second end 312. The second locking portion 22 of an L-shaped tab bends upwards from the frame 20 and includes a locking bar 221 disposed above the locking convex 321. When a user presses the second end 312 of the rotating plate 30 toward the frame 20 in order to lock the first locking portion 32 with the locking portion 22, the locking convex 321 moves over and abuts upwardly from below against the locking bar 221 which stops the locking convex 321 from moving upward.

Figure 8:
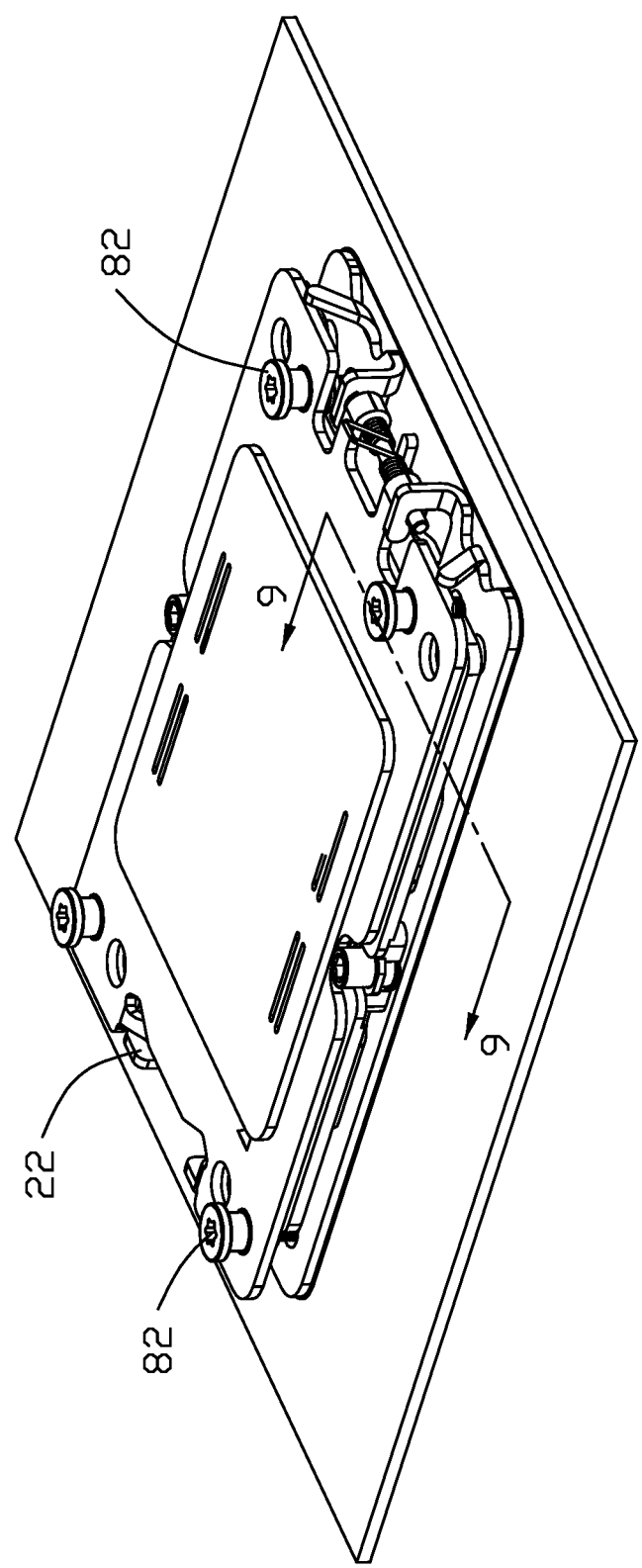
FIG. 8 is a perspective view of the chip connector with the chip module on the circuit board.
Figure 9:
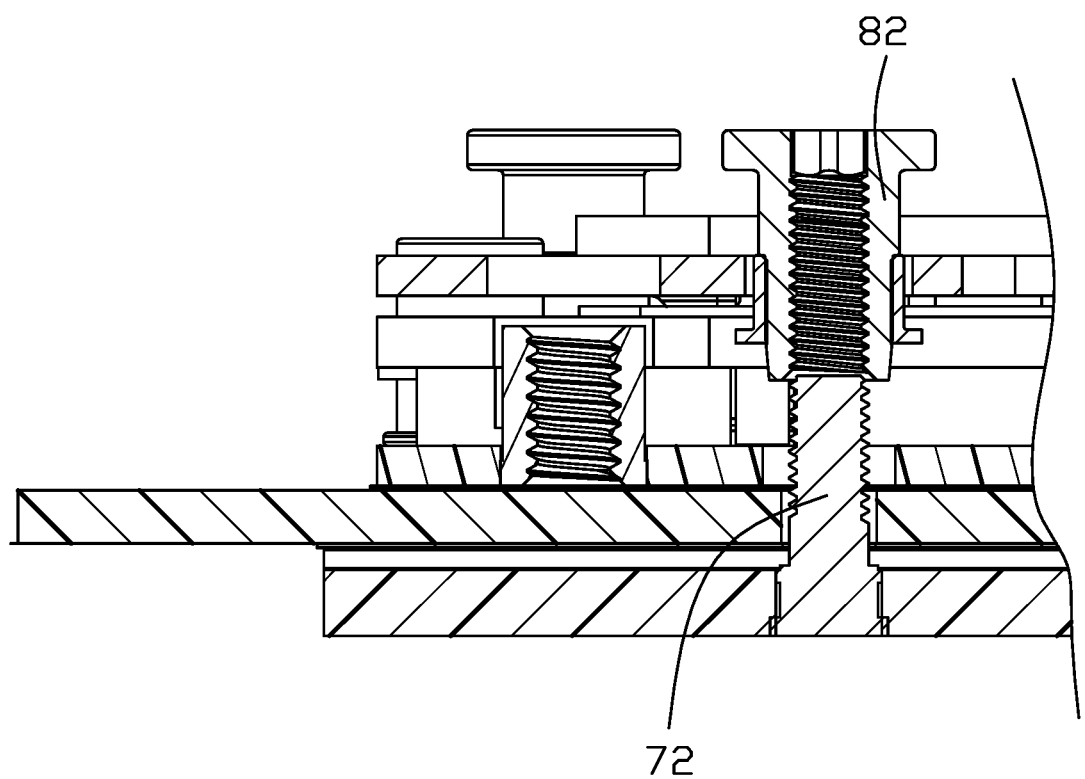
FIG. 9 is a cross-sectional view of the chip connector taken along line 9-9 in FIG. 8.

Referring to FIG. 7, in order to release the first locking portion 32 from being locked with the second locking portion 22, the second locking portion 22 is pushed by the first locking portion 32, by way of a user pulling the second end 312, to move outward and separate from the first locking portion 32, and then the rotating plate 30 rotates upward urged by the torsion shaft 33, leaving the housing 10 with the protective cover 40 exposed. The protective cover 40 is removed, leaving a chip-receiving cavity defined on the housing exposed, contact portions of the conductive terminals protrude into the chip-receiving cavity. A carrier 90 loaded with the chip module 300 is moved into the chip-receiving cavity and then the rotating plate 30 is pushed to rotate until the first locking portion 32 is locked with the second locking portion 22, as shown in FIG. 8. Four second nuts 82 are retained with four second bolts 72 for further securing the rotating plate 30. As can be seen from the above description, before the chip module 300 is installed, the independent carrying device 200a can be closed by pressing the first locking portion 32 toward the second locking portion and be opened by lifting the first locking portion 32 away from the second locking portion 22, thereby greatly simplifying the assembling process of the chip connector. After the chip module 300 is installed, further screw locking is need to ensure the stable locking of the rotating plate 30 and the housing 10, due to the increased outward torsion force caused by the conductive terminals and the chip module 300 accommodated in the housing 10.

In summary, the first locking portion 32 of the rotating plate 30 is locked with the second locking portion 22 of the frame 20 by pushing the rotating plate, both the two ends of the rotating plate 30 and the housing 10 are provided with locking components such as pairs of matching bolts and nuts for further locking. In the embodiment, the first bolts 71 go through the back plate 50, the circuit board 200 and the frame 20 and cooperates with the first nuts 81 for making the frame fixed on the circuit board 200. Four second bolts 72 pass through the back plate 50, the circuit board 200, the frame 20 and the rotating plate 30 and cooperate with the second nuts 82 for making them fixed on the circuit board 200.

Four positioning posts 25 protrude upward from the frame 10 and into the positioning holes 91 of the carrier 90 for a preliminary position of the carrier 90 when the carrier 90 is assembled into the frame body.

The above-mentioned embodiments are only preferred embodiments of the present invention, and should not limit the scope of the present invention, any simple equivalent changes and modifications made according to the claims of the present invention and the contents of the description should still belong to the present invention.

The invention claimed is:

1. A chip connector adapted for electrically connecting a chip module to a circuit board, comprising:
   an insulative housing loaded with a plurality of terminals and mounted on the circuit board;
   a frame surrounding the insulative housing and mounted on the circuit board; and
   a rotating plate defining a first end and a second end opposite to the first end, the first end of the rotating plate being pivotally installed on a first end of the frame;
   wherein the second end of the rotating plate defines a first locking portion, the frame defines a second locking portion at a second end thereof opposite to the first end thereof, and the second end of the rotating plate is capable of being pressed toward the frame to releasably lock the first locking portion with the second locking portion.

2. The chip connector as claimed in claim 1, further comprising first locking members at the first end and the second end of the rotating plate, and second locking members at the frame, and wherein the first locking members are one of nuts and bolts matching with each other, and the second locking members are the other of nuts and bolts.

3. The chip connector as claimed in claim 1, further comprising a back plate mounted on another side of the circuit board opposite to the frame and two first bolts, and wherein the first bolts run through the back plate and the circuit board and the frame and co-operate with first nuts to fix the frame to the circuit board.

4. The chip connector as claimed in claim 3, further comprising four second bolts, and wherein the four second bolts run through the back plate and the circuit board and the frame and the rotating plate and cooperate with second nuts to fix the rotating plate to the frame.

5. The chip connector as claimed in claim 1, further comprising a carrier, and the carrier is assembled between the housing and the rotating plate.

6. The chip connector as claimed in claim 5, wherein the frame defines four positioning posts protruding therefrom, and the carrier defines four corresponding positioning holes for the positioning posts to go through.

7. The chip connector as claimed in claim 1, wherein the first locking portion defines a locking convex, and the second locking portion defines a locking bar for abutting against the locking convex and restricting the locking convex from moving upward.

8. The chip connector as claimed in claim 7, wherein the first locking portion is of a vertical tab bending downward from the rotating plate, and the second locking portion is of an L-shaped tab bending upwards from the frame.

9. The chip connector as claimed in claim 8, wherein the first locking portion comprises two vertical tabs spacing apart from each other.

10. The chip connector as claimed in claim 4, wherein the rotating plate defines notches for the first nuts and bolts to pass through.

11. The chip connector as claimed in claim 1, wherein the first locking portion of the rotating plate comprises a pair of locking tabs bent from the second end thereof, the second locking portion of the frame comprises a pair of locking bars bent from the second end thereof, the locking tabs go across the locking bars and are locked with the locking bars for a preliminary locking of the rotating plate to the frame.

12. The chip connector as claimed in claim 1, wherein the first locking portion is released from the second locking portion by pulling the second end of the rotating plate.

* * * * *